United States Patent [19]
Coffman

[11] Patent Number: 5,297,093
[45] Date of Patent: Mar. 22, 1994

[54] ACTIVE CASCODE SENSE AMPLIFIER

[75] Inventor: Tim M. Coffman, Sugarland, Tex.

[73] Assignee: Texas Instruments Incorporated, Dallas, Tex.

[21] Appl. No.: 947

[22] Filed: Jan. 5, 1993

[51] Int. Cl.$^5$ .......................................... G11C 11/409
[52] U.S. Cl. ...................................... 365/208; 307/530
[58] Field of Search ........................ 365/207, 208, 214; 307/530

[56] References Cited

U.S. PATENT DOCUMENTS

| | | | |
|---|---|---|---|
| 5,012,448 | 4/1991 | Matsuoka et al. | 307/530 X |
| 5,029,138 | 7/1991 | Iwashita | 365/208 |
| 5,056,063 | 10/1991 | Santin et al. | 365/208 |
| 5,117,124 | 5/1992 | Dicke | 307/530 X |
| 5,189,322 | 2/1993 | Chan et al. | 307/530 |

Primary Examiner—Eugene R. LaRoche
Assistant Examiner—Christopher R. Glembocki
Attorney, Agent, or Firm—Tim Headley; Leo N. Heiting; Richard L. Donaldson

[57] ABSTRACT

An improved sense amplifier for a computer having non-volatile memories, each non-volatile memory having an array of memory cells, each cell having a drain, and the drains of all the cells for one column of cells connected to a drain-column line, The sense amplifier reads the state of the memory cell by a) sensing a reference current; b) providing drain-column voltage swings during the reference current sensing; c) sensing the current on the drain-column line; d) producing voltages above and below a reference voltage whereas the produced voltages represent the state of the memory cell; and, e) adjusting the bias of the biasing transistors in response to the produced voltages.

14 Claims, 9 Drawing Sheets

ACTIVE CASCODE SENSE AMPLIFIER

TECHNICAL FIELD OF THE INVENTION

This invention relates to computer systems which use non-volatile memories. More particularly, it relates to reading the state of the memory cells in the non-volatile memories.

BACKGROUND AND SUMMARY OF THE INVENTION

This invention relates to a semiconductor memory devices and more particularly to an improved sense amplifier for an electrically-erasable, electrically-programmable, read-only-memory (EEPROM) memory.

An EEPROM memory cell typically comprises a floating-gate field-effect transistor. The floating-gate conductor of a programmed memory cell is charged with electrons, and the electrons in turn render the source-drain path under the charged floating gate nonconductive when a predetermined voltage is applied to the control gate. The nonconductive state is read by a sense amplifier as a "zero" bit. The floating-gate conductor of a non-programmed cell is neutrally charged (or slightly positively or negatively charged) such that the source-drain path under the non-programmed floating gate is conductive when the predetermined voltage is applied to the control gate. The conductive state is read by a sense amplifier as a "one" bit.

Each column and row of an EEPROM array may contain thousands of floating-gate memory cells. The sources of each cell in a column are connected to a source-column line and the source-column line for a selected cell may be connected to reference potential or ground during reading of the selected cell by a sense amplifier. The drains of each cell in a column are connected to a separate bitline (drain-column line) and the drain-column line for a selected cell is connected to the input of the sense amplifier during reading of the selected cell. The control gates of each cell in a row are connected to a wordline, and the wordline for a selected cell is connected to the predetermined select voltage during reading of the selected cell.

Prior art sense amplifiers attempt to read the state of a selected memory cell by comparing the current of the selected memory cell to a reference cell current. While comparing the currents, the amplifier attempts to maintain a constant voltage on the drain-column line. However, noise can cause small voltage changes on the drain-column line, thus causing erroneous current readings. Therefore, the designer has to choose between increased amplifier gain or decreased sensitivity to noise.

The invention overcomes the above-noted and other deficiencies of the prior art by providing a method and apparatus for providing drain column voltage swings during current sensing. The invention features the capability of purposefully producing, on the column-drain line, voltages above and below a reference voltage in response to a reading of the state of the memory cell. As a result, the sense amplifier of the present invention achieves both increased gain and decreased noise sensitivity. In the sense amplifier the output of the sense amplifier is fed back to bias transistors in parallel with sensing transistors, to reinforce the output by positive feedback.

BRIEF DESCRIPTION OF THE DRAWINGS

The above-noted and other aspects of the present invention will become more apparent from a description of the preferred embodiment when read in conjunction with the accompanying drawings. The drawings illustrate the preferred embodiment of the invention. In the drawings the same members have the same reference numerals.

DETAILED DESCRIPTION OF THE INVENTION

Figure 1:
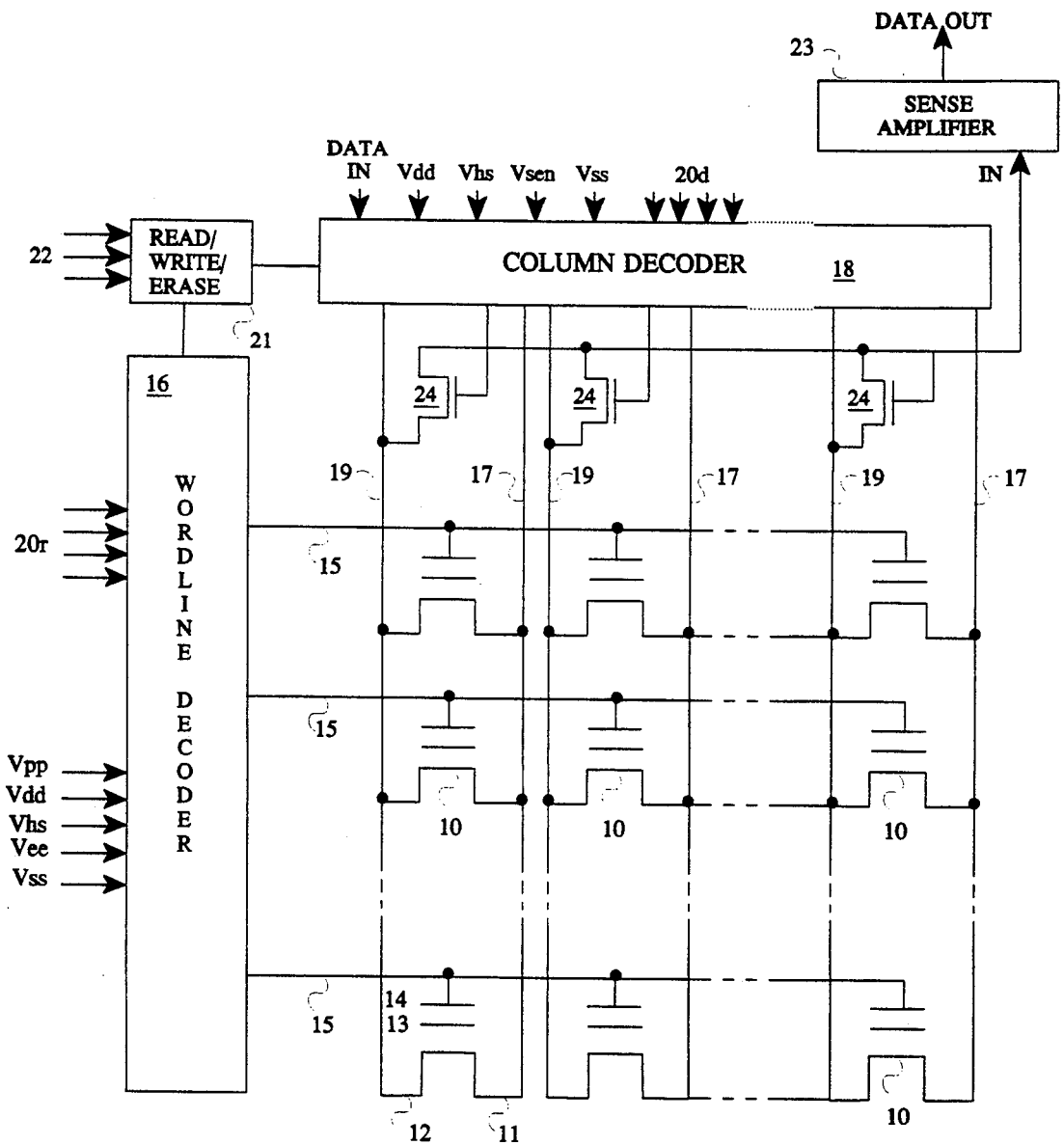
FIG. 1 is a representation of an array of nonvolatile memory cells showing connection to a sense amplifier.

Referring to FIG. 1, an example array of EEPROM memory cells, which is an integral part of a memory chip, is shown for the purpose of illustrating this invention. Each EEPROM cell is a floating-gate transistor 10 having a source electrode 11, a drain electrode 12, a floating gate 13 and a control gate 14. Each of the control gates 14 in a row of cells 10 is connected to a wordline 15, and each of the wordlines 15 is connected to a wordline decoder 16. Each of the source electrodes 11 in a column of cells 10 is connected to a source-column line 17, and each of the source-column lines 17 is connected to a column decoder 18. Each of the drain electrodes 12 in a column of cells 10 is connected to a drain-column line (bitline) 19, and each of the bitlines 19 is connected to the column decoder 18.

In a write or program mode, the wordline decoder 16 may function, in response to wordline address signals on lines 20r and to a signal from read/write/erase control circuit 21, to place a preselected first programming voltage Vpp (approx. +16 to +18 volts) on a selected wordline 15, including a selected control-gate conductor 14. Read/write/erase control circuit 21 acts in response to microprocessor signal inputs on lines 22. Column decoder 18, in response to signals on lines 20d and to a signal from read/write/erase control circuit 21, may function to place a preselected second programming voltage (reference potential Vss or ground, or a non-positive voltage) on selected source-column line 17, which includes a selected source region 11. The preselected second programming voltage Vss must differ sufficiently from the first preselected programming voltage Vpp that excess electrons will migrate, perhaps by Fowler-Nordheim tunnelling, to the selected floating-gate conductor 13 and, as a result, program that selected floating-gate conductor 13 Column decoder 18 may optionally, in response to signals on lines 20d and to a signal from read/write/erase control 21, place a third preselected voltage Vhs (approx. +7 volts above Vss) on deselected source-column lines 17, including deselected source regions 11 within the array, to prevent a disturb of programmed floating-gate conductors associated with the deselected source regions 11. The wordline decoder 16 may optionally, in response to wordline address signals on lines 20r and to a signal preselected voltage, which may also be Vhs (approx. +7 volts), on deselected wordlines 15, including deselected control-gate conductors 14. The fourth preselected voltage should be sufficiently close to the second programming voltage that the floating-gate conductors 13 associated with the deselected wordlines 15 will not be programmed as a result, but should be sufficiently high that stress will be reduced across any tunnelling windows of cells 10 in deselected wordlines 15, thereby avoiding de-programming of pre-programmed cells 10. The third and fourth preselected voltages should be placed on the respective electrodes before both first and second preselected programming voltages Vpp and Vss are both placed on their respective electrodes. The first programming voltage Vpp may be placed on the control-gate conductors 14 in a gradual manner so as to reduce voltage-induced stress on the selected cell 10. The drain-column lines 19 may be left floating. The floating gate 13 of the selected cell 10 is charged with electrons during programming, and the electrons in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

During erase mode of operation, the column decoder 18 may, for example, function to apply a positive voltage Vdd (approx. +5 volts) to the selected source-column line 17. The column decoder 18 may also, for example, function to leave at least the selected drain-column line 19 floating. The wordline decoder 16 may, for example, function to apply a high negative voltage Vee (approx. −11 volts) to the selected wordline 15. The applied voltages function to remove excess electrons from the floating gate 13 of the a selected programmed cell 10.

In the read mode, the wordline decoder 16 functions, in response to wordline address signals on lines 20r and to a signal from read/write/erase control circuit 21, to apply a preselected positive voltage Vdd (approx. +3 to +5 volts) to the selected wordline 15 (and the selected control gate 14), and to apply a low voltage (ground or Vss) to deselected wordlines 15. The column decoder 18 functions, in response to column address signals on lines 20d, to apply a preselected positive voltage Vsen (approx. +1 to +1.5 volts) to the selected drain-column line 19. The column decoder 18 also functions to connect all source-column lines 17 to ground (or Vss). The conductive or nonconductive state of the cell 10 connected to the selected drain-column line 19 and the selected wordline 15 is detected by sense amplifier 23, which supplies data to the DATA OUT terminal. The sense amplifier 23 is connected to the selected bitline 19 by the source-drain path of select field-effect transistor 24. The gate of select transistor 24 is connected to column decoder 18.

As is well-known, the source 11 regions and the drain 12 regions of the memory cells 10 may be interchanged for the various modes of operation. For example, Fowler-Nordheim tunnelling for programming and/or erasing may take place between a drain 12 region and a floating-gate conductor 13, or between a source 11 region and a floating-gate conductor 13. Voltages applied to the source 11 and drain 12 regions in the read example above are interchangeable. Therefore, the terms "source" and "drain" as used herein are considered interchangeable for each mode of operation. The term "source-drain electrode" is used herein to imply a connection to either source 11 or drain 12.

For convenience, a table of read, write and erase voltages is given in the TABLE I below:

TABLE I

|  | Read | Write | Erase |
|---|---|---|---|
| Selected Wordline | 3–5 V | 16–18 V | −11 V |
| Deselected Wordlines | 0 V | 7 V |  |
| Selected Source Line | 0 V | 0 V | 5 V |
| Deselected Source Lines | Float | 7 V |  |
| Drain Lines | 1–1.5 V | Float | Float |

Figure 2:
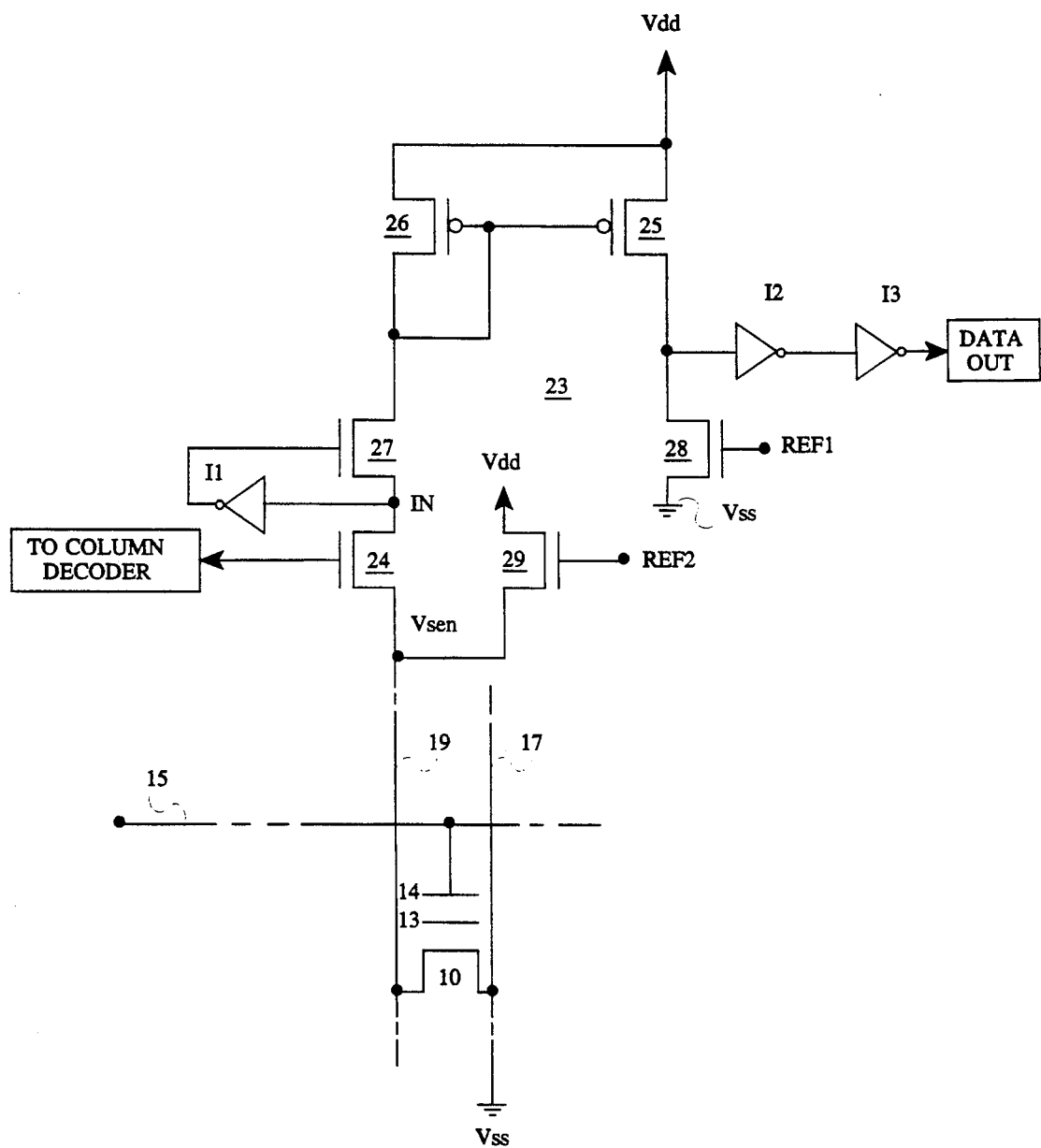
FIG. 2 is a schematic representation of a prior-art sense amplifier.

FIG. 2 illustrates schematically a prior-art sense amplifier, or current-mirror circuit, 23. As in FIG. 1, bitline 19 is connected to a representative floating-gate memory cell 10. The control gate 14 of memory cell 10 is connected to a wordline 15, which is connected to wordline decoder 16 of FIG. 1. Source-column line 17 is connected by column decoder 18 of FIG. 1 to a reference potential Vss, which may be ground. The source-drain path of N-conductivity-type select transistor 24 connects the input of sense amplifier 23 to bitline 19 of the selected cell 10. The gate of select transistor 24 is connected to column decoder 18 of FIG. 1. The prior-art sense amplifier includes a pair of P-conductivity-type current-mirror transistors 25 and 26 in which field effect transistor 25 mirrors the current through load mirror transistor 26. Current-mirror transistors 25 and 26 each have a commonly-connected source-drain electrodes and have gates connected to each other. The commonly-connected source-drain electrodes of transistor 25 and 26 are connected to supply-voltage source Vdd. Transistors 25 and 26 may ratio current such that the current through transistor 25 is, for example, equal to twice the current through transistor 26. A predetermined ratio may be realized by the well-known practice of forming the respective source-drain paths of transistors 25 and 26 with proper relative dimensions. The gate of current-mirror transistor 26 is connected to its second source drain electrode, which is also connected to a source-drain electrode of the source-drain path of optional N-conductivity-type cascode transistor 27. The second source-drain electrode of transistor 27, or the input "IN" of sense amplifier 23, is connected to the input of optional inverter I1. The output of inverter I1 is connected to the gate of cascode transistor 27. The cascode connection of inverter I1 and transistor 27 serves to improve the access time for the memory array. If the impedance at the input terminal IN is low, the inverter I1 will cause transistor 27 to conduct and if the impedance input terminal IN is high, the inverter I1 will cause transistor 27 to be nonconductive. A impedance corresponding to, but increased over, the bitline impedance at terminal IN is measured at the common terminal of transistors 26 and 27.

The second source-drain electrode of P-conductivity-type field-effect transistor 25 is connected to a source-drain electrode of N-conductivity-type reference transistor 28. The second source drain electrode of reference transistor 28 is connected to a source Vss of reference potential and the gate of reference transistor 28 is connected to a derived-voltage source REF1. The derived-voltage source REF1 may be derived from a dummy cell to provide compensation for process variations during manufacture. The output of the prior-art sense amplifier 23 is taken from the commonly connected source-drain electrodes of transistors 25 and 28 and is transmitted through two optional series-connected inverters I2 and I3 in the customary manner to cause the output signal to driven to high and low logic levels.

If a selected memory cell 10 has an uncharged (programmed "1") floating gate, then current will flow through the source-drain path of selected select transistor 24 when the selected wordline 15 is energized at read voltage Vdd. The current will be mirrored through transistors 26 and 25, amplified by inverters I2 and I3, causing a "1" to appear at the output DATA OUT of the sense amplifier 23. If a selected memory cell 10 has a charged (programmed "0") floating gate, then no or little current will flow through the source-drain path of selected select transistor 24 when the selected wordline 15 is energized at read voltage Vdd. The current will be mirrored through transistors 26 and 25, amplified by inverters I2 and I3, causing a "0" to appear at the output DATA OUT of the sense amplifier 23.

Figure 3:
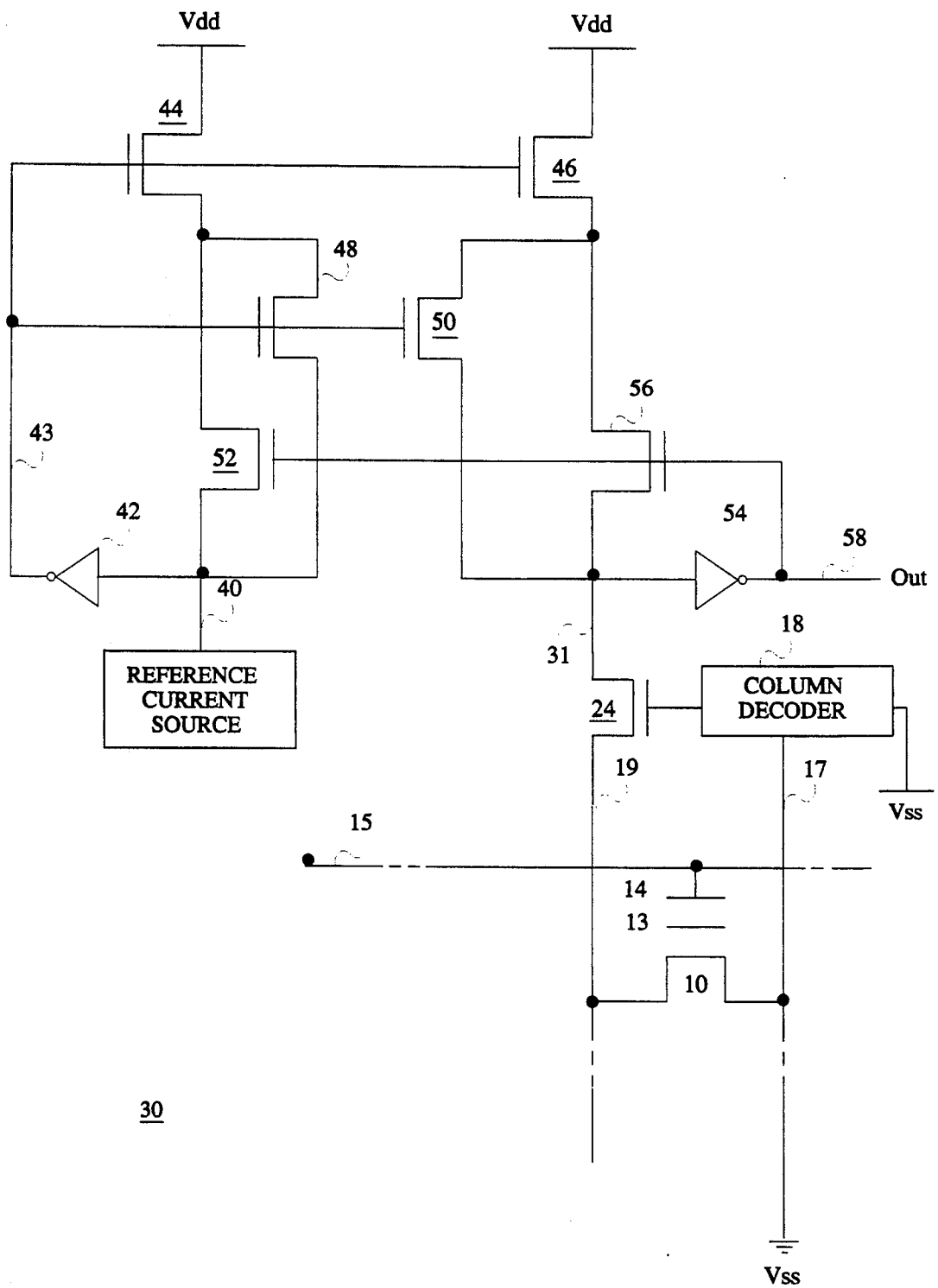
FIG. 3 is a schematic representation of the sense amplifier of the present invention.

Referring now to FIG. 3, an active cascode sense amplifier 30, built according to the present invention, is illustrated using six N-conductivity-type transistors. As in FIG. 1, the bitline 19 is connected to a representative floating-gate memory cell 10. The control gate 14 of the memory cell 10 is connected to the wordline 15, which is connected to the wordline decoder 16 of FIG. 1. The source-column line 17 is connected by the column decoder 18 of FIG. 1 to a reference potential Vss, which may be ground. The source-drain path of the N-conductivity-type select transistor 24 (shown in FIG. 1) connects the input line 31 of the sense amplifier 30 to the bitline 19 of the selected cell 10. The gate of the select transistor 24 is connected to the column decoder 18 of FIG. 1.

As is commonly known in the art, a floating gate transistor such as the floating gate transistor 10 may be used to establish a reference current $I_{REF}$. The reference current $I_{REF}$ is read on a line 40, which is connected to a reference current source.

The line 40 connects to an inverter 42. The output of the inverter 42 on a line 43 connects to the gates of transistors 44, 46, 48, and 50. The transistors 44 and 46 are bias transistors. The transistors 48 and 50 are sensing load transistors, for sensing the currents on lines 31 and 40. The conductance of the transistors 48 and 50 is determined by the reference current $I_{REF}$. The line 40 also connects to a first source-drain electrode of each of transistors 48 and 52. The second source drain electrode of the transistors 48 and 52 are connected to each other and to a first source-drain electrode of the transistor 44. The second source-drain electrode of the transistor 44 connects to the supply voltage source Vdd.

The line 31 connects to the input of an inverter 54, and to first source-drain electrodes of transistors 50 and 56. The output of the inverter 54 on a line 58 connects to the gates of transistors 52 and 56. The transistors 52 and 56 are sensing load transistors. The conductance of the transistors 52 and 56 is determined by the voltage on line 31.

The second source-drain electrodes of the transistors 50 and 56 are connected to each other and to a first source-drain electrode of the transistor 46. The second source-drain electrode of the transistor 46 connects to the supply voltage source Vdd.

The width of the P channel of the inverters 42 and 54 is four microns, and the width of the N channel of the inverters 42 and 54 is 40 microns. The N channel of the transistor 48 has a width of 30 microns and a length of 8 microns. The N channel of the transistor 50 has a width of 10 microns and a length of 8 microns. In an alternate embodiment, in which the currents on the lines 31 and 40 are substantially equal, other N-conductivity-type transistors could be used for the transistors 48 and 50 as long as the width to length ratio of the N channels is different for the two transistors. In still another alternate embodiment, the ratios are the same, and the currents on the lines 31 and 40 are different. Depending on the ratio selected, the output on the line 58 will change from a "0" to a "1" at a different current level on the line 31 with respect to the reference current on the line 40. The N channel of the transistors 44, 46, 52, and 56 has a width of 40 microns and a length of 2 microns.

In operation, the ratio of the P and N channel devices of the inverter 42 are set to provide a maximum voltage of approximately 1.2 volts on the lines 31 and 40 by modulating the gate voltage on the transistors 44, 46, 48, and 50. If the line 31 has a potential less than approximately 1.2V, the inverter 54 will drive the gates of the transistors 52 and 56 to a higher potential. Very little current will flow through the transistors 48 and 50 in this condition. If little current is drawn from the line 31, its voltage will increase. This will cause the output of the inverter 54 to go to a lower potential and turn OFF the transistor 56. When the line 58 goes LOW, the transistor 52 is turned OFF so that the voltage on the line 40 decreases. This causes the output voltage of the inverter 42 to increase and the output of the inverter 54 on the line 58 to decrease, thus reinforcing the output on line 58 by positive feedback.

Figure 4:
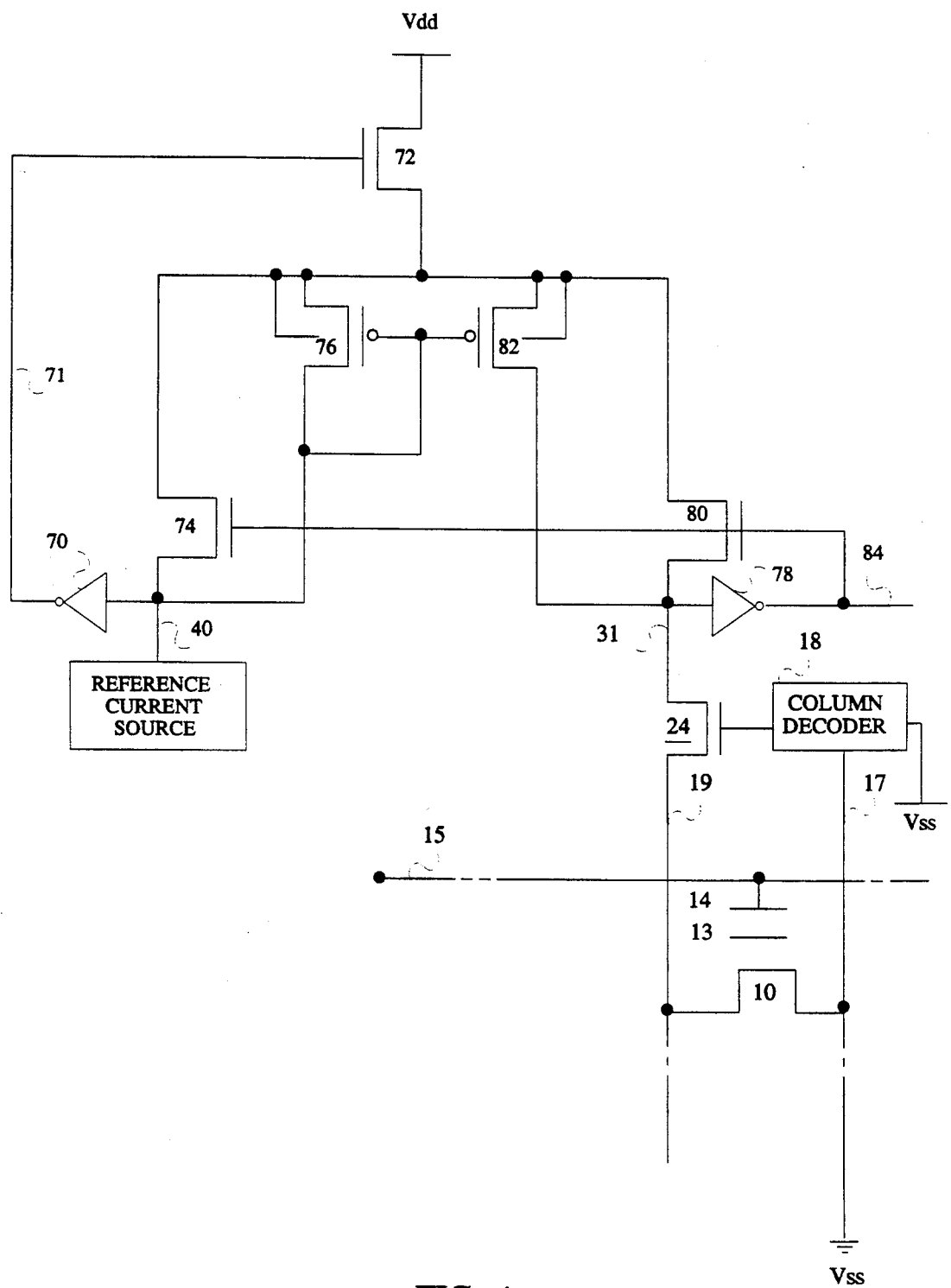
FIG. 4 is a schematic representation of a first alternate embodiment of the sense amplifier of the present invention.
Figure 5:
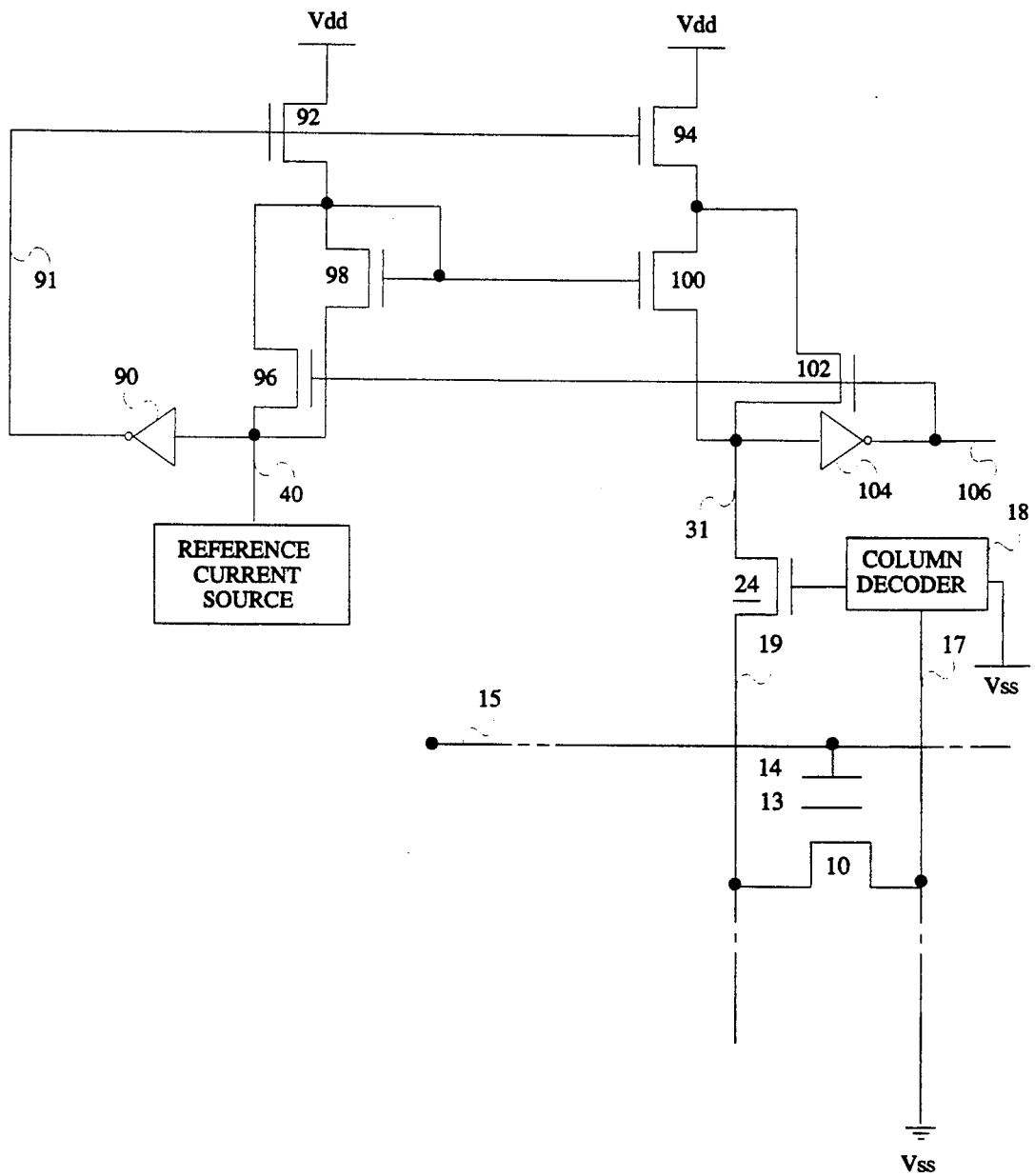
FIG. 5 is a schematic representation of a second alternate embodiment of the sense amplifier of the present invention.

Two alternate embodiments of the circuit of the present invention are depicted in FIGS. 4 and 5. Referring now to FIG. 4, an alternate embodiment of the sense amplifier 30, or current-mirror circuit, of this invention is illustrated using two P-Channel, or P-conductivity-type, transistors and three N-Channel, or N-conductivity-type, transistors. P-Channel current mirrors replace the transistors 48 and 50 of the preferred embodiment in FIG. 3. The voltage swing on the line 31 due to current change on the line 31 is therefore one voltage threshold plus body effect. The line 40 from the reference current source connects to an inverter 70. The output of the inverter 70 on a line 71 connects to the gate of an N-Channel transistor 72. A first source-drain electrode of the transistor 72 connects to the supply voltage source Vdd. The line 40 also connects to a first source-drain electrode of an N-Channel transistor 74, and to a first source-drain electrode of a P-Channel transistor 76.

The line 31 connects to the input of an inverter 78, to a first source-drain electrode of an N-Channel transistor 80, and to a first source-drain electrode of a P-Channel transistor 82. The output of the inverter 78 on a line 84 connects to the gates of the transistors 74 and 80. The second source-drain electrodes of the transistors 74 and 80 are connected to the second source-drain electrodes of the transistors 72, 76, and 82. The line 40 also connects to the gates of the transistors 76 and 82. The bulk, or well, terminals of the transistors 76 and 82 connect to the second source-drain electrodes of the transistors 72, 74, 76, 80, and 82.

Referring now to FIG. 5, an alternate embodiment of the sense amplifier 30, or current-mirror circuit, of this invention is illustrated using six N-Channel, or N-conductivity-type, transistors. N-Channel current mirrors replace the transistors 48 and 50 of the preferred embodiment of FIG. 3. The voltage swing on line 31 due to current change on line 31 is therefore one voltage threshhold plus body effect.

The line 40 from a reference current source connects to an inverter 90. The output of the inverter 90 on a line 91 connects to the gates of transistors 92 and 94. First source-drain electrodes of the transistors 92 and 94 connect to the supply voltage source Vdd. The line 40 also connects to first source-drain electrodes of transistors 96 and 98. Second source-drain electrodes of the transistors 96 and 98 are connected together, to a second source-drain electrode of the transistor 92, to the gate of the transistor 98, and to the gate of a transistor 100. A first source-drain electrode of the transistor 100 is connected to a second source-drain electrode of the transistor 94 and to a first source-drain electrode of a transistor 102.

The line 31 connects to the input of an inverter 104, to a second source-drain electrode of the transistor 100, and to a second source-drain electrode of the transistor 102. The output of the inverter 104 on a line 106 connects to the gates of the transistors 96 and 102.

Figure 6:
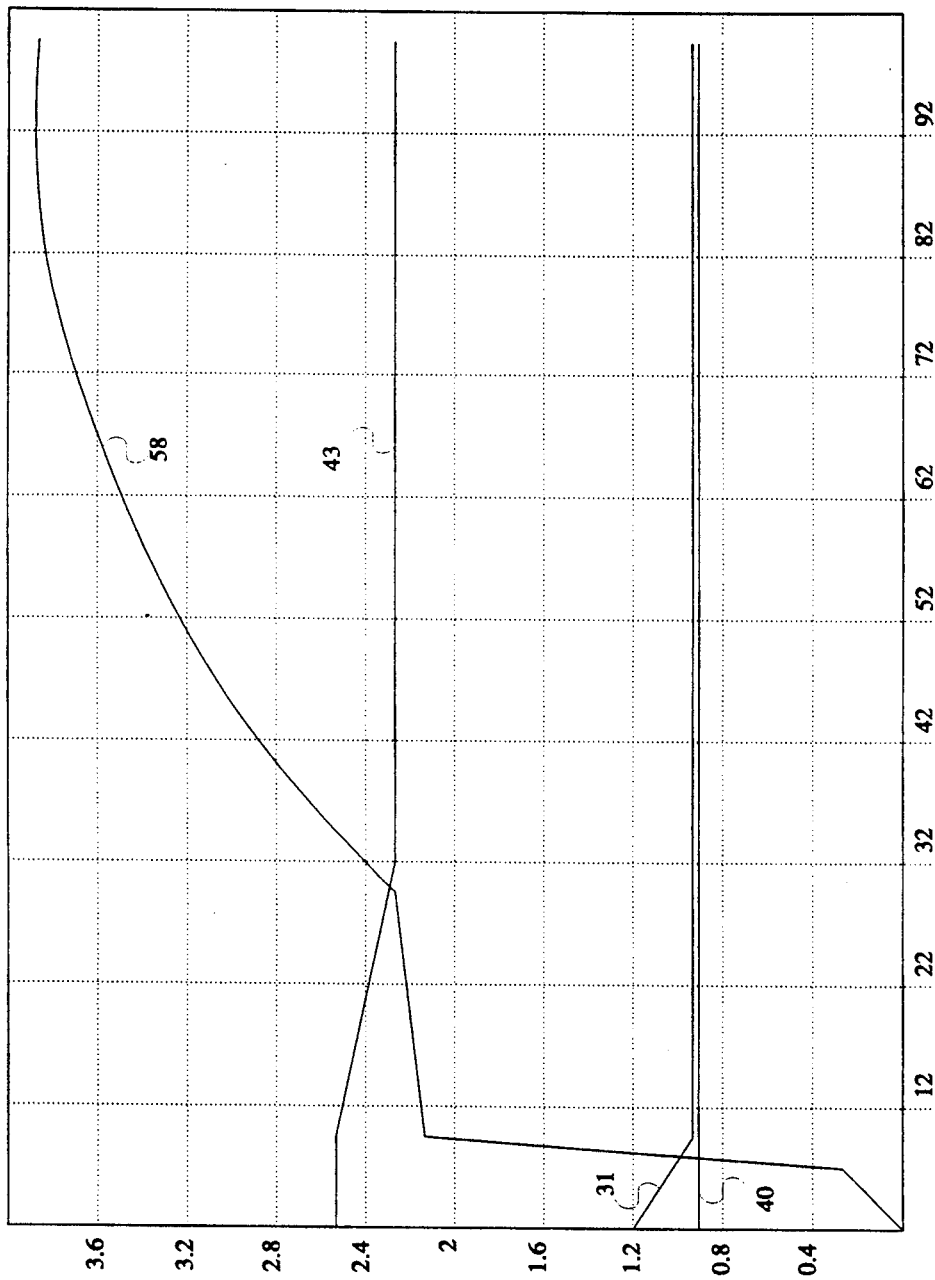
FIG. 6 is a graphical comparison of the reference and sensed voltages from the simulation of the sense amplifier of the present invention.

FIG. 6 is a graphical comparison of the reference and sensed voltages from the simulation program (SPICE: Simulation Program with Integrated Circuit Emphasis) of the sense amplifier of the present invention. The current on line 40 was held constant at 30 microamps while the current on line 31 was swept from zero to 100 microamps. The voltage on lines 31, 40, 43, and 58 is graphed versus the currents on lines 31 and 40. The voltage on line 58 switches from low to high at approximately 10 microamps, which is one-third of the current on line 40. The voltage swing on line 31 is approximately 0.5 volts. As the current increases on line 31, the voltage on line 43 modulates to maintain a desired bias point.

Figure 7:
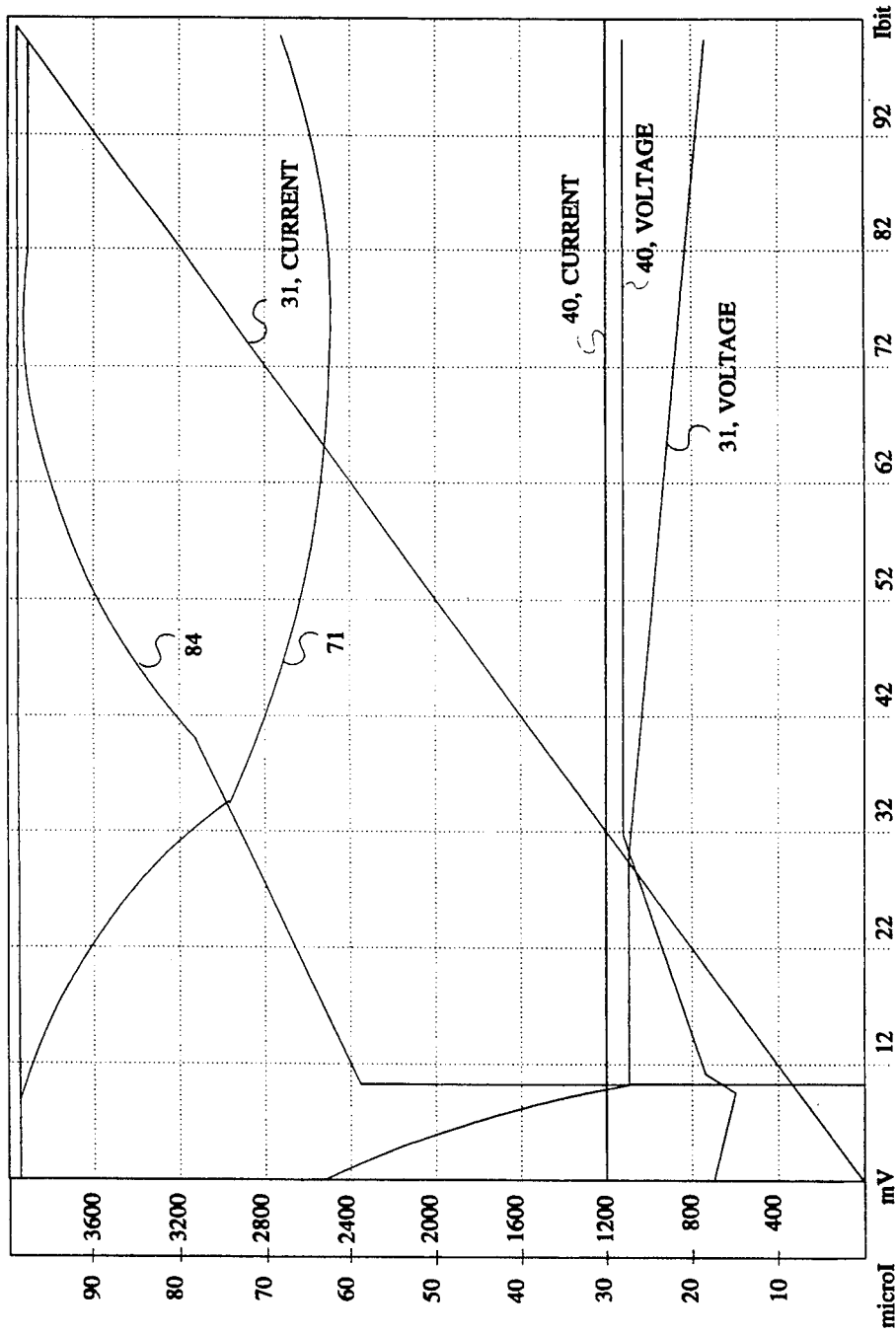
FIG. 7 is a graphical comparison of the reference and sensed voltages and currents from the simulation of the first alternate embodiment of the sense amplifier of the present invention.

FIG. 7 is a graphical comparison of the reference and sensed voltages and currents from the simulation of the alternate embodiment of FIG. 4 of the sense amplifier of the present invention. The current on line 40 was held constant at 30 microamps while the current on line 31 was swept from zero to 100 microamps. The voltage on lines 31, 40, 71, and 84 is graphed versus the currents on lines 31 and 40. The voltage on line 84 switches from low to high at approximately 10 microamps, which is one-third of the current on line 40. The voltage swing on line 31 is approximately 1.5 volts. As the current increases on line 31, the voltage on line 71 modulates to maintain a desired bias point.

Figure 8:
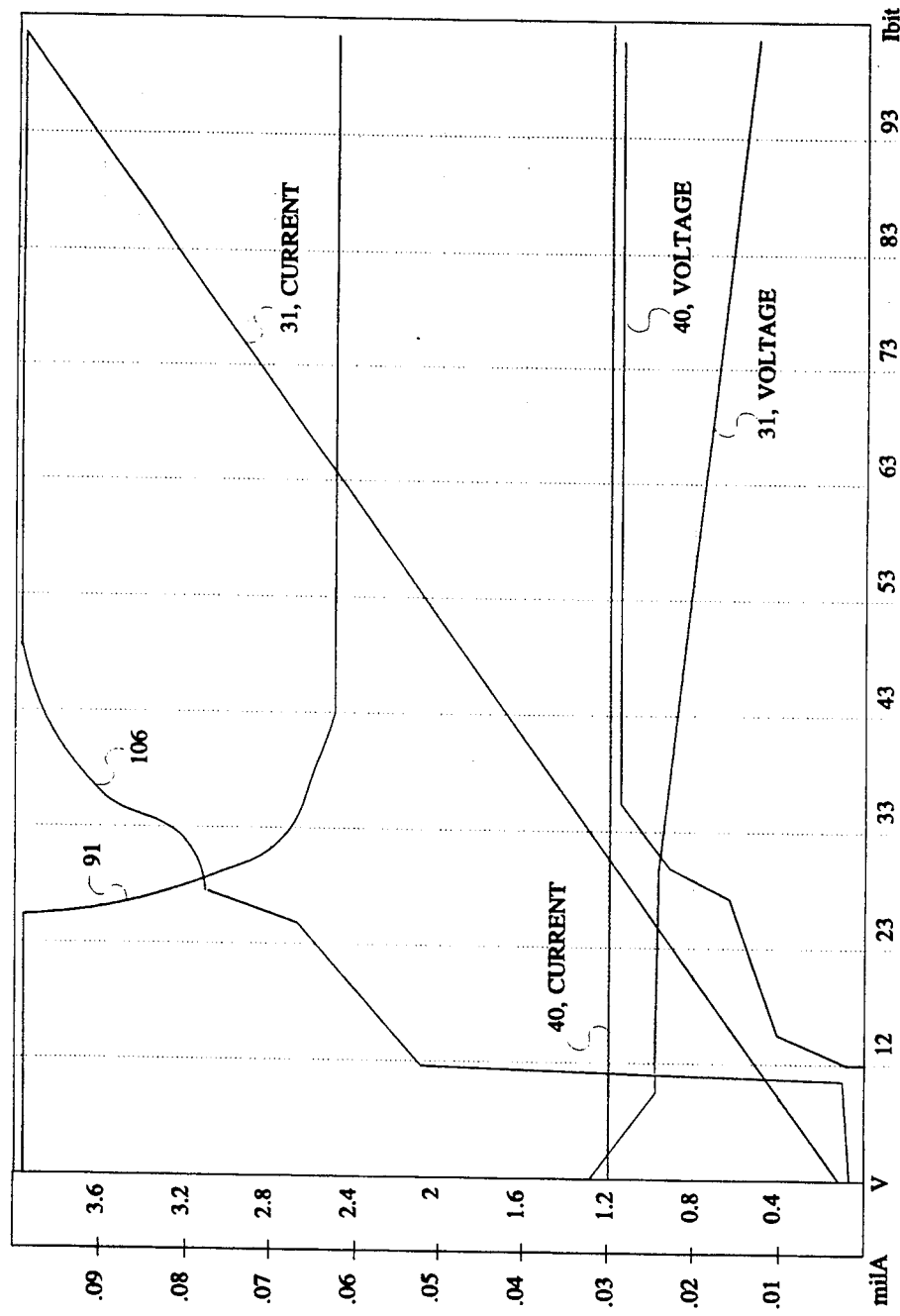
FIG. 8 is a graphical comparison of the reference and sensed voltages and currents from the simulation of the second alternate embodiment of the sense amplifier of the present invention.

FIG. 8 is a graphical comparison of the reference and sensed voltages and currents from the simulation of the alternate embodiment of FIG. 5 of the sense amplifier of the present invention. The current on line 40 was held constant at 30 microamps while the current on line 31 was swept from zero to 100 microamps. The voltage on lines 31, 40, 91, and 106 is graphed versus the currents on lines 31 and 40. The voltage on line 106 switches from low to high at approximately 10 microamps, which is one-third of the current on line 40. The voltage swing on line 31 is approximately 1 volt. As the current increases on line 31, the voltage on line 91 modulates to maintain a desired bias point.

Figure 9:
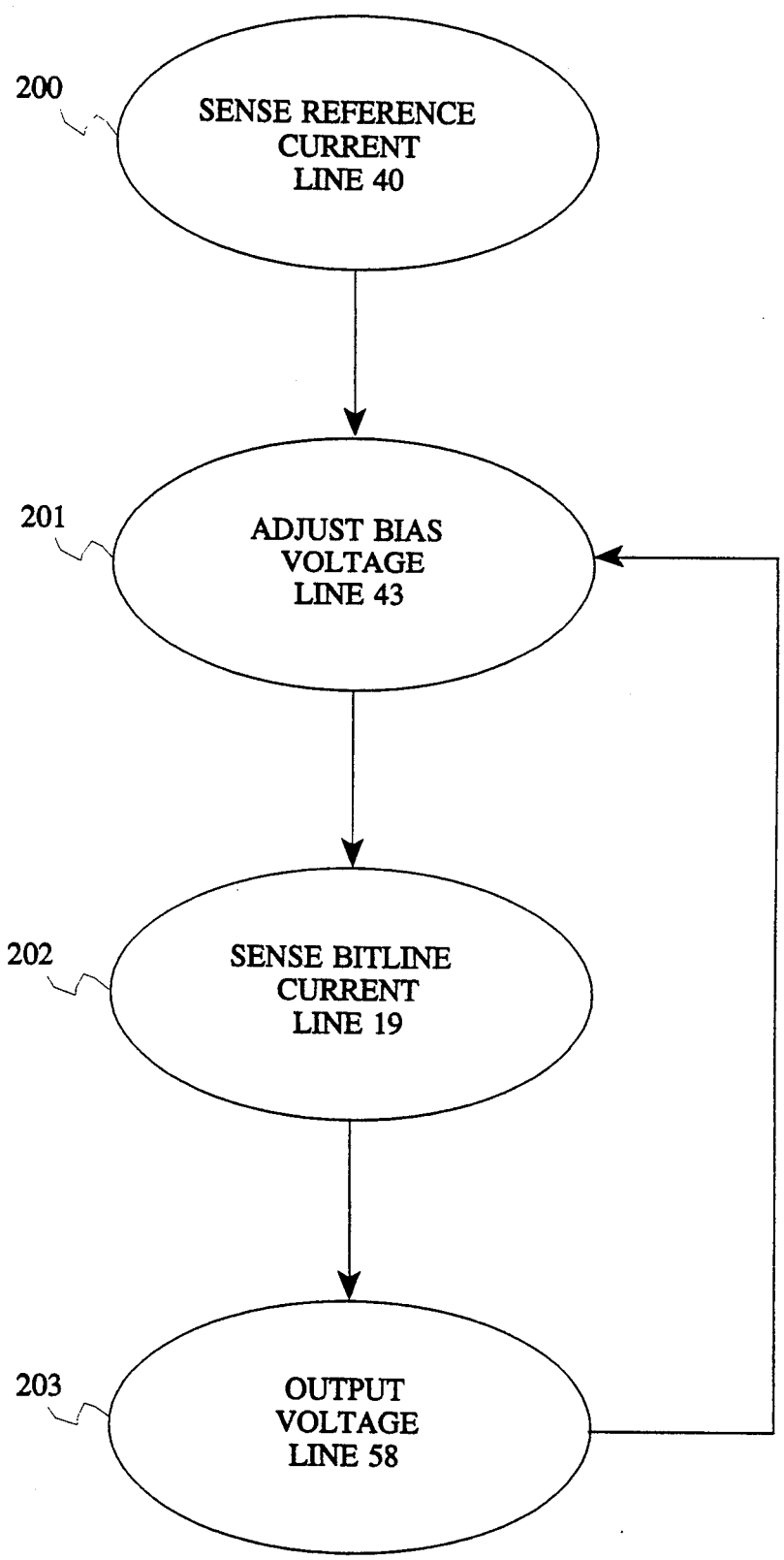
FIG. 9 is a flow chart of the method of the present invention.

FIG. 9 is a flow chart of the method of the present invention. In step 200, the sense amplifier senses a reference current on line 40. In step 201, the sense amplifier adjusts the bias voltage on line 43 as a function of the reference current on line 40 and the output voltage on line 58. In step 202 the sense amplifier senses the bitline current on line 19. In step 203 the sense amplifier outputs a voltage on line 58.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

What is claimed is:

1. A sense amplifier, comprising:

an input and an output;

a supply-voltage source, a reference current source, and a reference potential;

first and second bias transistors, each having a first and a second source-drain electrode and a gate, each first source-drain electrode of each current-mirror transistor connected to the supply-voltage source, each gate of the first and second bias transistors connected to the other gate;

first and second sensing load transistors, each having a first and a second source-drain electrode and a gate, the first source-drain electrode of the first sensing load transistor connected to the first source-drain electrode of the first bias transistor, the first source-drain electrode of the second sensing load transistor connected to the second source-drain electrode of the second bias transistor, each gate of the first and second sensing load transistors connected to the other gate, and to the gates of the first and second bias transistors, the second source-drain electrode of the first sensing load transistor connected to the current reference source, the second source-drain electrode of the second sensing load transistor connected to the input of the sense amplifier;

third and fourth sensing load transistors, each having a first and a second source-drain electrode and a gate, each gate of the third and fourth sensing load transistors connected to the other gate and to the output of the sense amplifier, the first source-drain electrode of the third sensing load transistor connected to the second source-drain electrode of the first bias transistor, and the second source-drain electrode of the third sensing load transistor connected to the current reference source, the first source-drain electrode of the fourth sensing load transistor connected to the second source-drain electrode of the second bias transistor, and the second source-drain electrode of the third sensing load transistor connected to the input of the sense amplifier;

a first inverter having an input and an output, the input of the first inverter connected to the current reference source of the sense amplifier, the output the first inverter connected to the gates of the first and second bias transistors and to the gates of the first and second sensing load transistors; and a second inverter having an input and an output, the input of the second inverter connected to the input of the sense amplifier, the output of the second inverter connected to the output of the sense amplifier.

2. The sense amplifier of claim 1, including
at least one bitline input;
at least one column-decoder input; and
at least one select transistor having a source-drain path and a gate, the source-drain path of the select transistor connected between the input of the sense amplifier and the bitline input, and the gate of the select transistor connected to a column-decoder input.

3. The sense amplifier of claim 1, wherein the N channel of the first and second bias transistors, and of the third and fourth sensing load transistors, has a width of about 40 microns and a length of about 2 microns.

4. The sense amplifier of claim 1, wherein the width of the P channel of the inverters is about four microns, the width of the N channel of the inverters is about 40 microns, the N channel of the third transistor has a width of about 30 microns and a length of about 8 microns, and the N channel of the fourth transistor has a width of about 10 microns and a length of about 8 microns.

5. The sense amplifier of claim 1, wherein the current flowing through the sense amplifier input is substantially equal to the current flowing from the current reference source, and the width to length ratio of the N channels is different for the third and fourth transistors.

6. The sense amplifier of claim 1, wherein the width to length ratios of the N channels of the third and fourth transistors are the same, and the currents flowing through the sense amplifier input and flowing from the current reference source are different.

7. A sense amplifier, comprising:
an input and an output;
a supply-voltage source, a current reference source, and a reference potential;
first and second current-mirror transistors of a first conductivity-type, each current-mirror transistor having a first and a second source-drain electrode and a gate, the first source-drain electrode of the first current-mirror transistor connected to furnish a signal to the output of the sense amplifier, the first source-drain electrode of the second current-mirror transistor connected to the current reference source of the sense amplifier, each gate of the first and second current-mirror transistors connected to the other gate, the gate of the second current-mirror transistor connected to the first source-drain electrode of the second current-mirror transistor;
a first transistor of a second conductivity-type having a first and a second source-drain electrode and a gate, the first source-drain electrode of the first transistor connected to the supply-voltage source, the second source-drain electrode of the first transistor connected to the second source-drain electrodes of the current-mirror transistors,
a first inverter having an input and an output, the input of the first inverter connected to the current reference source of the sense amplifier, the output of the first inverter, connected to the gate of the first transistor, of the second conductivity type a second transistor of the second conductivity-type a first and a second source-drain electrode and a gate, the first source-drain electrode of the second transistor connected to the current reference source, the second source-drain electrode of the second transistor of the second conductivity type connected to the second source-drain electrodes of the current-mirror transistors; and a third transistor of the second conductivity-type having a first and a second source-drain electrode and a gate, the first source-drain electrode of the third transistor of the second conductivity type connected to the input of the sense amplifier, the second source-drain electrode of the third transistor connected to the second source-drain electrodes of the current-mirror transistors, the gates of the second and third transistors connected to each other and to the output of the sense amplifier.

8. The sense amplifier of claim 7, including
at least one bitline input;
at least one column-decoder input; and
at least one select transistor of the second conductivity-type having a source-drain path and a gate, the source-drain path of the select transistor connected between the input of the sense amplifier and the bitline input, the gate of the select transistor connected to a column-decoder input.

9. The sense amplifier of claim 7, wherein the first conductivity-type is P-type and the second conductivity-type is N-type.

10. The sense amplifier of claim 7, further comprising a second inverter having an input and an output, the input of the second inverter connected to the input of the sense amplifier, and the output of the second inverter connected to the output of the sense amplifier.

11. A sense amplifier, comprising:
an input and an output;
a supply-voltage source, a current reference source, and a reference potential;
first and second bias transistors, each having a first and a second source-drain electrode and a gate, each first source-drain electrode of each of the first and second bias transistors connected to the supply-voltage source, each gate of the first and second current-mirror transistors connected to the other gate;
first and second current-mirror transistors, each having a first and a second source-drain electrode and a gate, the first source-drain electrode of the first current-mirror transistor connected to the second source-drain electrode of the first bias transistor, the first source-drain electrode of the second current-mirror transistor connected to the second source-drain electrode of the second bias transistor, each gate of the first and second current-mirror transistors connected to the other gate, and to the second source-drain electrode of the first bias transistor, and to the first source-drain electrode of the first current-mirror transistor, the second source-drain electrode of the first current-mirror transistor connected to the current reference source the second source-drain electrode of the second current-mirror transistor connected to the input of the sense amplifier;
first and second cascode transistors, each having a first and a second source-drain electrode and a gate, each gate of the first and second cascode transistors connected to the other gate and to the output of the sense amplifier, the first source-drain electrode of the first cascode transistor connected to the second source-drain electrode of the first bias transistor, and the second source-drain electrode of the first bias transistor connected to the current reference source the first source-drain electrode of the second cascode transistor connected to the second source-drain electrode of the second bias transistor, and the second source-drain electrode of the second cascode transistor connected to the input of the sense amplifier;

a first inverter having an input and an output, the input of the first inverter connected to the current reference source of the sense amplifier, the output of the first inverter connected to the gates of the first and second bias transistors; and a second inverter having an input and an output, the input of the second inverter connected to the input of the sense amplifier, the output of the second inverter connected to the output of the sense amplifier.

12. The sense amplifier of claim 11, including at least one bitline input;

at least one column-decoder input; and at least one select transistor having a source-drain path and a gate, the source-drain path of the select transistor connected between the input of the sense amplifier and the bitline input, the gate of the select transistor connected to a column-decoder input.

13. In a computer having non-volatile memories, each non-volatile memory having an array of memory cells, each cell having a drain, and the drains of all the cells for one column of cells connected to a drain-column line, a method for reading the state of a memory cell, comprising the steps of:

(a) sensing a reference current;

(b) providing drain-column voltage swings during the reference current sensing;

(c) sensing the current on the drain-column line;

(d) purposefully producing voltages above and below a reference voltage, the produced voltages representing the state of the memory cell;

(e) using the voltages produced in step (d) to adjust the bias for the drain-column voltage swings in step (b) above; and (f) repeating steps (c) and (d) above, wherein steps (b) through (f) are repeated at least once.

14. In a computer having non-volatile memories, each non-volatile memory having an array of memory cells, each cell having a drain, and the drains of all the cells for one column of cells connected to a drain-column line, a sense amplifier for reading the state of a memory cell, the sense amplifier comprising:

(a) means for sensing a reference current;

(b) means for providing drain-column voltage swings during the reference current sensing;

(c) means for sensing the current on the drain-column line;

(d) means for purposefully producing voltages above and below a reference voltage, the produced voltages representing the state of the memory cell; and (e) means for biasing the drain-column voltage swings, using the produced voltages.

* * * * *